United States Patent [19]

Narabu

[11] Patent Number: 4,542,301
[45] Date of Patent: Sep. 17, 1985

[54] CLOCK PULSE GENERATING CIRCUIT

[75] Inventor: Tadakuni Narabu, Kanagawa, Japan

[73] Assignee: Sony Corporation, Tokyo, Japan

[21] Appl. No.: 543,870

[22] Filed: Oct. 20, 1983

[30] Foreign Application Priority Data

Oct. 21, 1982 [JP] Japan ............................ 57-184989

[51] Int. Cl.[4] ...................... H03K 5/15; G11C 19/18; G11C 19/28
[52] U.S. Cl. .................................... 307/269; 377/79; 377/81; 377/76
[58] Field of Search ...................... 307/262, 269, 481; 377/73, 74, 76, 78, 79, 81, 104, 105

[56] References Cited

U.S. PATENT DOCUMENTS

| | | | |
|---|---|---|---|
| 3,395,292 | 7/1968 | Bogert | 377/79 |
| 3,576,447 | 4/1971 | McKenny | 377/79 |
| 4,034,301 | 7/1977 | Kashio | 377/79 X |
| 4,295,055 | 10/1981 | Takemoto et al. | 377/79 X |

Primary Examiner—Larry N. Anagnos

Attorney, Agent, or Firm—Lewis H. Eslinger; Alvin Sinderbrand

[57] ABSTRACT

A clock pulse generating circuit comprises a plurality of circuit blocks connected in series successively to form a multistage configuration, each of alternate ones of which at the odd stages is composed of a first switching element being supplied with a first timing signal, first capacitive element coupled in series with the first switching element and an a NOR gate circuit to which a voltage obtained at the connecting point between the first switching element and the first capacitive element and the first timing signal are supplied, and each of another alternate ones of which at the even stages is composed of a second switching element supplied with a second timing signal, a second capacitive element coupled in series with the second switching element and an inverter to which a voltage obtained at the connecting point between the second switching element and the second capacitive element. The first one of the circuit blocks is supplied with a starting signal and the alternate circuit blocks at the odd stages are used for delivering output pulses therefrom.

4 Claims, 5 Drawing Figures

CLOCK PULSE GENERATING CIRCUIT

BACKGROUND OF THE INVENTION

This invention relates generally to clock pulse generating circuits constituted in the form of shift registers, and more particularly, to a clock pulse generating circuit of the shift register type for producing multiphase clock pulses used for driving a charge transfer device which is adapted to be driven in the manner of electrode-per-bit clocking.

Multiphase clock pulses are necessitated for driving a charge transfer device adapted to be driven by the electrode-per-bit clocking. In the case of such electrode-per-bit clocking for the charge transfer device, as shown in FIG. 1, multiphase clock pulses $V_1$, $V_2$, $V_3$, - - - each having a pulse width $\tau_1$ and being supplied to the charge transfer device are required not to have overlapping portions but to have a time interval $\tau_2$ between each two of them appearing sucessively. Further, for increasing the transfer efficiency to the utmost, it is desirable that the pulse width $\tau_1$ and the time interval $\tau_2$ are capable of being varied in response to clock pulses supplied from the outside without varying a time interval $\tau_1+\tau_2$ between rising edges or falling edges of each successively appearing two of the pulses $V_1$, $V_2$, $V_3$, - - - .

There has been proposed a pulse generating circuit for producing multiphase clock pulses, which is constituted in the form of a shift register, as shown in FIG. 2.

In the circuit of FIG. 2, circuit blocks 1, 2, 3, - - - , in each of which a switching element S and a capacitive element C are connected in series with each other and a voltage obtained at the connecting point between the switching element S and the capacitive element of C is supplied to an inverter I, are connected successively to form a plurality of stages in such a manner as that an output end of the inverter I in one of them is coupled to the series connection of the switching element S and the capacitive element C in the next one of them. Further, an output end of an inverter $I_0$ is connected to the series connection of the switching element S and the capacitive element C in the circuit block $V_1$ at the first stage and a starting signal $\phi_0$ is supplied to the inverter $I_0$. The switching elements S in the circuit blocks 1, 3, 5, - - - at the odd stages are controlled to be turned on or off by a first timing signal $\phi_1$, while the switching elements S in the circuit blocks 2, 4, 6, - - - at the even stages are controlled to be turned on or off by a second timing signal $\phi_2$.

In more detail, the switching element S is formed with an insulated gate field effect transistor of the enhancement type with its gate to which the first or second timing signal $\phi_1$ or $\phi_2$ is supplied. Each of the inverters $I_0$ and I is formed with an insulated gate field effect transistor of the enhancement type E and an insulated gate field effect transistor of the depletion type D with its gate and source connected to the drain of the field effect transister E. The gate of the field effect transister E is supplied with the starting signal $\phi_0$ or voltage obtained at the connecting point between the switching element S and the capacitive element C, and the drain of the field effect transistor E is used as an output terminal.

Each of the first and second timing signals $\phi_1$ and $\phi_2$ is composed of positive pulses having a constant cyclical period $\tau_3$, and a period of each pulse taking a high level by which the switching element S is turned on in the timing signal $\phi_1$ is not coincident with a period of each pulse taking a high level by which the switching element S is turned on in the timing signal $\phi_2$, as shown in FIG. 3. That is, the timing signals $\phi_1$ and $\phi_2$ are different in phase from each other. The starting signal $\phi_0$ is formed into positive pulses having a cyclical period sufficiently longer than the cyclical period $\tau_3$ of each of the first and second timing signals $\phi_1$ and $\phi_2$, and a period of each positive pulse taking a high level and forming the starting signal $\phi_0$ includes one of the periods of the pulses forming the first timing signal $\phi_1$.

In this circuit, the field effect transistor E in the inverter $I_0$ is made conductive and therefore the output voltage of the inverter $I_0$ takes a ground level during the period of the pulses of the starting signal $\phi_0$. Within the period of the pulse of the starting signal $\phi_0$, when the first timing signal $\phi_1$ rises to the high level from the low level, the switching element S in the circuit block 1 at the first stage is turned on and the voltage across the capacitive element C in the circuit block 1 takes the ground level, so that the field effect transistor E forming the inverter I in the circuit block 1 is turned off and therefore the output voltage $V_1'$ of the circuit block 1 takes the level of a voltage source $+V_{CC}$. This condition is maintained, after the first timing signal $\phi_1$ falls to the low level from the high level and switching element S in the circuit block 1 is turned off, up to an instant at which the first timing signal $\phi_1$ rises again to the high level from the low level. Before the first timing signal $\phi_1$ rises again to the high level from the low level, when the second timing signal $\phi_2$ rises to the high level from the low level, the switching element S in the circuit block 2 at the second stage are turned on and the voltage across the capacitive element C in the circuit block 2 takes a level almost equal to the level of the voltage source $+V_{CC}$, so that the field effect transistor E forming the inverter I in the circuit block 2 is turned on and therefore the output voltage of the circuit block 2 takes the ground level.

Then, when the first timing signal $\phi_1$ rises again to the high level from the low level, the switching element S in the circuit block 1 at the first step is again turned on. On this occasion, since the field effect transistor E forming the inverter $I_0$ has been turned off and the output voltage of the inverter $I_0$ takes the level of the voltage source $+V_{CC}$, the voltage across the capacitive element C in the circuit block 1 takes the level almost equal to the level of the voltage source $+V_{CC}$ and therefore the field effect transistor E forming the inverter I in the circuit block 1 is turned on, so that the output voltage $V_1'$ of the circuit block 1 takes the ground level. Simultaneously, the switching element S in the circuit block 3 at the third stage is turned on. On this occasion, the switching element S in the circuit block 2 has been turned off and the voltage across the capacitive element C in the circuit block 2 is maintained to take the level almost equal to the level of the voltage source $+V_{CC}$ even though the output voltage $V_1'$ of the circuit block 1 takes the ground level. Further, since the field effect transistor E forming the inverter I in the circuit block 2 is conductive and the output voltage of the circuit block 2 takes the ground level, the voltage across the capacitive element C in the circuit block 3 takes the ground level and therefore the field effect transistor E forming the inverter I in the circuit block 3 is turned off, so that an output voltage $V_2'$ of the circuit block 3 takes the level almost equal to the level of the voltage source $+V_{CC}$.

After that, the circuit operates continuously in the same manner as mentioned above and the output voltages $V_1'$, $V_3'$, $V_5'$, - - - having respective identical periods of the high level, which do not overlap between each two appearing successively, are obtained from the circuit blocks 1, 3, 5, - - - positioned at the first, third, fifth, - - - stages, respectively, as multiphase clock pulses. However, as apparent from FIG. 3, the period of each of these pulses $V_1'$, $V_3'$, $V_5'$, - - - is set to coincide with a period from one rising edge to the next rising edge of the first timing signal $\phi_1$, that is, the cyclical period $\tau_3$ of the first timing signal $\phi_1$ and therefore therein no time interval between each successively appearing two of them.

Accordingly, if it is intended to obtain multiphase clock pulses having a predetermined time interval between each two of them appearing successively from the pulses generating circuit as mentioned above, it is necessary to derive the output voltages $V_1'$, $V_5'$, - - - from the circuit blocks 1, 5, - - - positioned at the first, fifth, - - - stages. That is, the output voltages are derived every four circuit blocks to produce the multiphase clock pulses.

However, when such a pulse generating circuit in which the output voltages from every four circuit blocks are derived to produce multiphase clock pulses is used for generating n phase clock pulses, the pulse generating circuit must be constituted to contain $\{1+4(n-1)\}$ circuit blocks each composed of the switching element S, capacitive element C and inverter I, and consequently, have to employ a great number of circuit elements. Besides, in such case, since both a pulse width of each of the n phase clock pulses and a time interval between rising edges or falling edges of successively appearing two of them are determined by the cyclical period $\tau_3$ of the first timing signal $\phi_1$, it is impossible to vary the pulse width of each of the n phase clock pulses without varying the time interval between the rising edges or falling edges of successively appearing two of them.

OBJECTS AND SUMMARY OF THE INVENTION

Accordingly, it is an object of the present invention to provide a clock pulse generating circuit constituted in the form of a shift register, which can avoid the above described disadvantages of the prior art.

Another object of the present invention is to provide a clock pulse generating circuit of the shift register type, which can produce multiphase clock pulses having a time interval between each two of them appearing successively, with the configuration employing a relatively small number of circuit elements.

A further object of the present invention is to provide a clock pulse generating circuit of the shift register type, which can produce multiphase clock pulses and vary a pulse width of each of the produced pulses and a time interval between each successively appearing two of the produced pulses without varying a time interval between rising edges or falling edges of each successively appearing two of the produced pulses, with the configuration employing a relatively small number of circuit elements.

According to an aspect of the present invention, there is provided a clock pulse generating circuit comprising a plurality of circuit blocks connected successively to form a multistage configuration, each of alternate ones of which at the even stages is not used for delivering an output pulse therefrom and composed of a switching element, a capacitive element connected in series with the switching element and an inverter to which the voltage obtained at the connecting point between the switching element and the capacitive element, and each of another alternate ones of which at the odd stages is used for delivering the output pulse therefrom and composed of a switching element, a capacitive element connected in series with the switching element and a NOR gate circuit to which the voltage obtained at the connecting point between the switching element and the capacitive element and one of a pair of timing signals are supplied.

The above, and other objects, features and advantages of the present invention will become apparent from the following detailed description thereof in conjunction with the accompanying drawings.

DESCRIPTION OF THE PREFERRED EMBODIMENT

Figure 1:
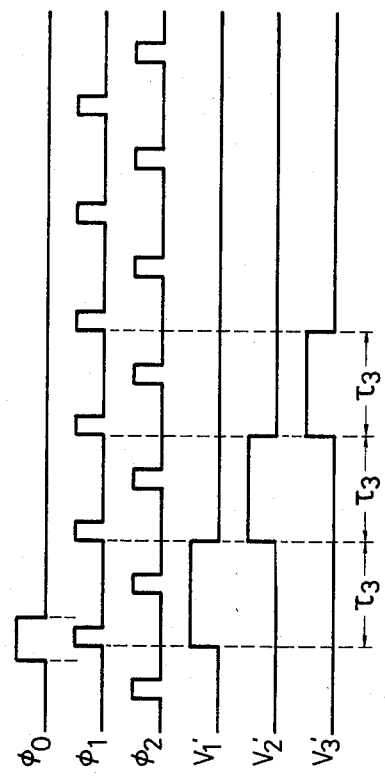
FIG. 1 shows waveforms a set of examples of multiphase clock pulses being to be produced by a clock pulse generating circuit according to the present invention.
Figure 2:
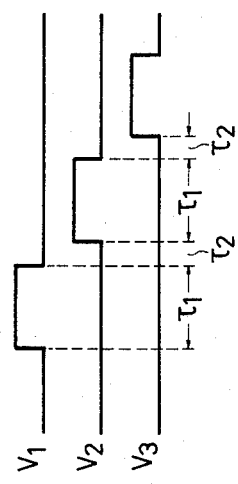
FIG. 2 is a circuit diagram showing a previously proposed pulse generating circuit for producing multiphase clock pulses.
Figure 3:
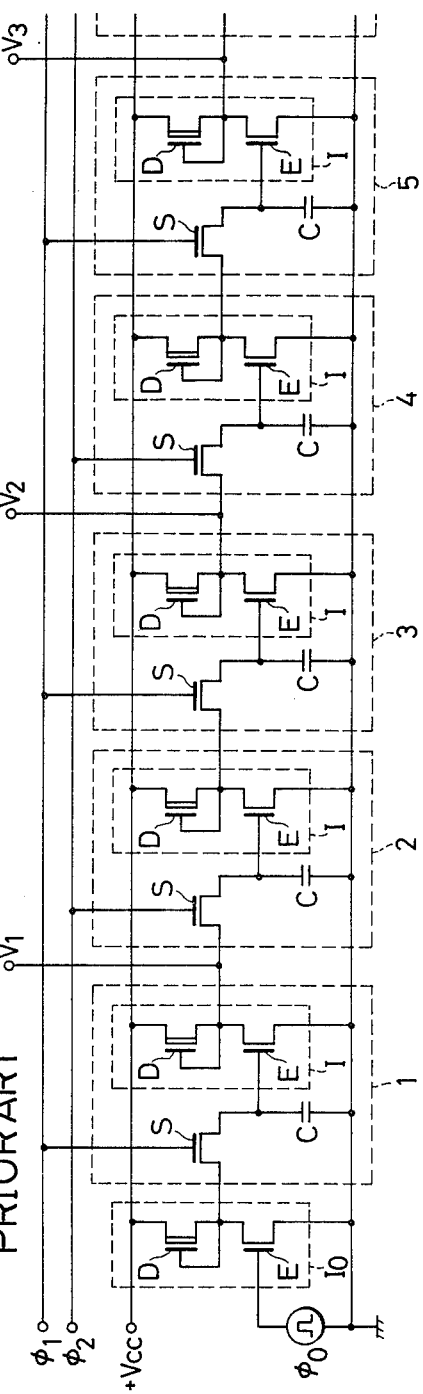
FIG. 3 shows waveforms of multiphase pulses and timing signals used for explaining the operation of the pulse generating circuit shown in FIG. 2.
Figure 4:
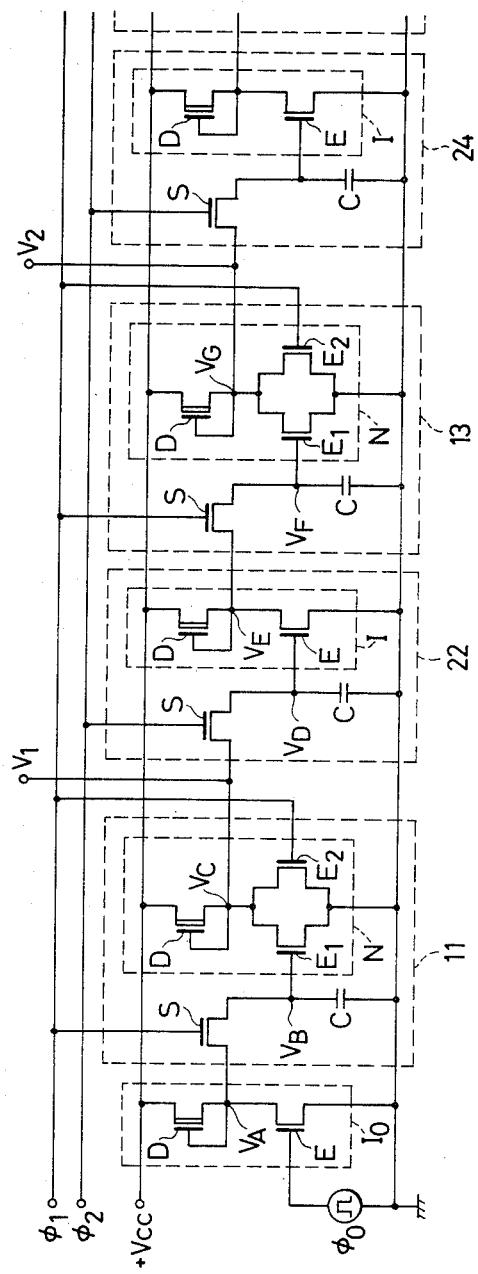
FIG. 4 is a circuit diagram showing an embodiment of clock pulse generating circuit according to the present invention.

FIG. 4 shows an example of a clock pulse generating circuit according to the present invention. In FIG. 4, elements and signals corresponding to those in FIG. 2 are marked with the same references. In this example, first circuit blocks 11, 13, - - - and second circuit blocks 22, 24, - - - are connected alternately in series to form a plurality of stages. Each of the first circuit blocks 11, 13, - - - is composed of the switching element S and the capacitive element C connected in series with each other and a NOR gate circuit N. The switching element S therein is controlled by the first timing signal $\phi_1$ to be turned on or off and the NOR gate circuit N is supplied with the voltage obtained at the connecting point between the switching element and the capacitive element C and the first timing signal. $\phi_1$. Each of the second circuit blocks 22, 24, - - - is composed of the switching element S and the capacitive element C connected in series with each other and the inverter I. The switching element S therein is controlled by the second timing signal $\phi_2$ to be turned on or off and the inverter I is supplied with the voltage obtained at the connection point between the switching element S and the capacitive element C. One of the first circuit blocks 11, 13, - - - and one of the second circuit blocks 22, 24, - - - disposed at two successive stages are connected in such a manner as that the output of the NOR gate circuit N or the inverter I is connected to the series connection of the switching element S and the capacitive element C.

Further, the inverter $I_0$ is provided with its output connected to the series connection of the switching element S and the capacitive element C in the first circuit block 11 at the first stage, and the starting signal $\phi_0$ is supplied to the inverter $I_0$.

In more detail, the switching element S in each of the first and second circuit blocks 11, 22, 13, 24, - - - is formed with an insulated gate field effect transistor of the enhancement type with its gate to which the first or second timing signals $\phi_1$ or $\phi_2$ is supplied. Each of the inverter $I_0$ and the inverters I in the second circuit blocks 22, 24, - - - at the even stages is formed with an insulated gate field effect transistor of the enhancement type E and an insulated gate field effect transistor of the depletion type D with its gate and source connected to the drain of the field effect transistor E. The gate of the field effect transistor E is supplied with the starting signal $\phi_0$ or the voltage obtained at the connecting point between the switching element S and the capacitive element C, and the drain of the field effect transistor E is used as an output terminal. Each of the NOR gate circuits in the first circuit blocks 11, 12, - - - at the odd stages is formed with a couple of insulated gate field effect transistors $E_1$ and $E_2$ with their sources connected to each other and their drains connected to each other, and an insulated gate field effect transistor D with its gate and source connected to the drains of the field effect transistors $E_1$ and $E_2$ connected in common. The gate of the field effect transistor $E_1$ is supplied with the voltage obtained at the connecting point between the switching element S and the capacitive element C and the gate of the field effect transistor $E_2$ is supplied with the first timing signal $\phi_1$. Further, the connecting point between the drains of the field effect transistors $E_1$ and $E_2$ is used as an output terminal.

Figure 5:
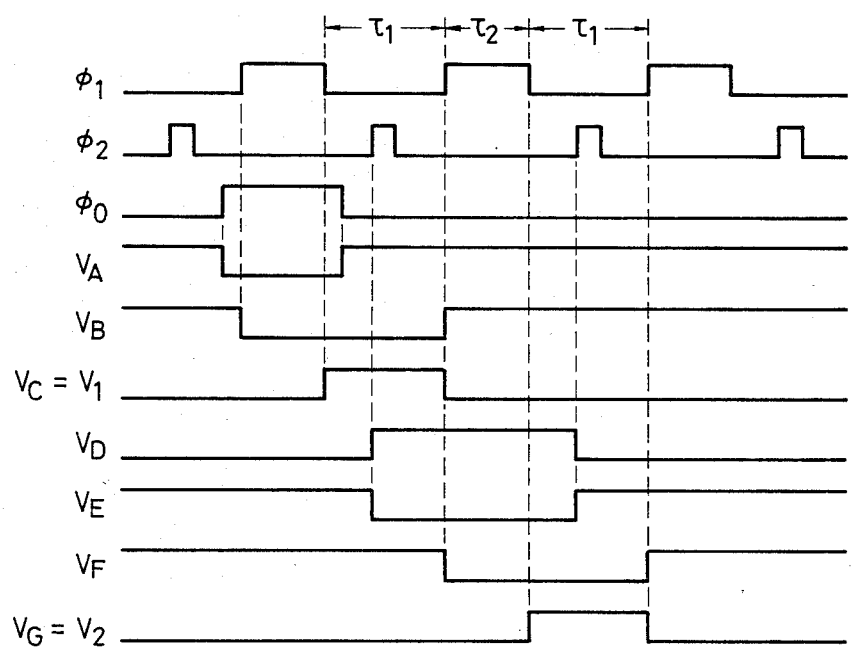
FIG. 5 shows waveforms of multiphase pulses and timing signals used for explaining the operation of the embodiment shown in FIG. 4.

In the circuit thus constituted, as shown in FIG. 5, an output voltage $V_A$ of the inverter $I_0$ takes the ground level during the period of the pulse of the starting signal $\phi_0$. Within the period of the pulse of the starting signal $\phi_0$, when the first timing signal $\phi_1$ rises to the high level from the low level, the switching element S in the circuit block 11 at the first stage is turned on and a voltage $V_B$ across the capacitive element C in the circuit block 11 takes the ground level, so that the field effect transistor $E_1$ forming the NOR gate circuit N in the circuit block 11 is turned off. At this time, since the field effect transistor $E_2$ forming the NOR gate circuit N in the circuit block 11 is turned on by the high level taken by the first timing signal $\phi_1$, an output voltage $V_C$ of the NOR gate circuit N in the circuit block 11, that is, an output voltage $V_1$ of the circuit block 11 is maintained to take the ground level. After that, within the period of the pulse of the starting signal $\phi_0$, when the first timing signal $\phi_1$ falls to the low level from the high level, the field effect transistor $E_2$ forming the NOR gate circuit N in the circuit block 11 is turned off and therefore the output voltage $V_1$ of the circuit block 11 rises to the level of the voltage source $+V_{CC}$, as shown in FIG. 5. Then, the first timing signal $\phi_2$ rises to the high level from the low level before the first timing signal $\phi_1$ rises again to the high level from the low level, the switching element S in the circuit block 22 at the second stage is turned on and therefore a voltage $V_D$ across the capacitive element C in the circuit block 22 takes a level almost equal to the level of the voltage source $+V_{CC}$, as shown in FIG. 5, so that an output voltage $V_E$ of the inverter I in the circuit block 22 takes the ground level, as shown in FIG. 5.

When the first timing signal $\phi_1$ rises again to the high level from the low level, the switching element S in the circuit block 11 at the first stage is again turned on. On this occasion, since the output voltage $V_A$ of the inverter $I_0$ has taken the level almost equal to the level of the voltage source $+V_{CC}$, the voltage $V_B$ across the capacitive element C in the circuit block 11 takes the level almost equal to the level of the voltage source $+V_{CC}$ and the field effect transistor $E_1$ forming the NOR gate circuit N in the circuit block 11 is turned on, so that the output voltage $V_1$ of the circuit block 11 takes the ground level. Simultaneously, the switching element S in the circuit 13 at the third stage is turned on. On this occasion, the switching element S in the circuit block 22 at the second stage has been turned off and a voltage $V_D$ across the capacitive element C in the circuit block 22 is maintained to take the level almost equal to the level of the voltage source $+V_{CC}$ even though the output voltage $V_1$ of the circuit block 11 takes the ground level, so that the output voltage $V_E$ of the circuit block 22 is also maintain to take the ground level, as shown in FIG. 5. Accordingly, a voltage $V_F$ across the capacitive element C in the circuit block 13 takes the ground level, as shown in FIG. 5, and the field effect transistor $E_1$ forming the NOR gate circuit N in the circuit block 13 is turned off. However, since the field effect transistor $E_2$ forming the NOR gate circuit N in the circuit block 13 is turned on by the first timing signal $\phi_1$ taking the high level, an output voltage $V_G$ of the NOR gate circuit N in the circuit block 13, that is, an output voltage $V_2$ of the circuit block 13 is maintained to take the ground level. Then, when the first timing signal $\phi_1$ falls again to the low level from the high level, the field effect transistor $E_2$ forming the NOR gate circuit N in the circuit block 13 is turned off and therefore the output voltage $V_2$ rises to the level almost equal to the level of the voltage source $+V_{CC}$, as shown in FIG. 5.

After that, the circuit operates continuously in the same manner as mentioned above and the output voltage $V_1$, $V_2$, - - - having respective identical periods $\tau_1$ of the high level, which do not overlap but are accompanied with a time interval $\tau_2$ between each two of them appearing successively, are obtained from the circuit blocks 11, 13, - - - disposed at the odd stages, respectively, as desired multiphase clock pulses having a pulse width corresponding to the period $\tau_1$ and the time interval $\tau_2$ between each successively appearing two of them.

In this case, since the period $\tau_2$, that is, pulse width of each of these multiphase pulses is set to coincide with a time interval between each successive two pulse periods of the high level of the first timing signal $\phi_1$ and the time interval $\tau_2$ between each successively appearing two of these multiphase pulses is set to coincide with each pulse period of the high level of the first timing signal $\phi_1$, the pulse width $\tau_1$ of each of the produced multiphase pulses and the time interval $\tau_2$ between each successively appearing two of the produced multiphase clock pulses can be varied by varying the length of each pulse period of the high level of the first timing signal $\phi_1$ without varying thereby a time interval $\tau_1+\tau_2$ between rising edges or falling edges of each successively appearing two of them.

What is claimed is:

1. A clock pulse generating circuit for producing multiphase clock pulses, comprising;

an input terminal for being supplied with an input signal containing a pulse;

first and second clocking terminals for delivering first and second timing signals, respectively, each of said first and second timing signals being composed of pulses having a constant cyclical period and a period of each pulse of first timing signal being not coincident with a period of each pulse of said second timing signal without overlapping to each other;

plural first circuit blocks each comprising a first switching element being supplied with said first timing signal, a first capacitive element coupled in series with said first switching element, and a NOR gate circuit connected to be supplied with said first timing signal and a voltage obtained at the connecting point between said first switching element and said first capacitive element; and plural second circuit blocks each connected between each successive two of said first circuit blocks to form a series multistate configuration and each comprising a second switching element being supplied with said second timing signal, a second capacitive element coupled in series with said second switching element, and an inverter connected to be supplied with a voltage obtained at the connecting point between said second switching element and said second capacitive element, said second switching element being also connected to the output end of the NOR gate circuit in one of successive two of said first circuit blocks and the output end of the inverter is connected to the first switching element in the other of said successive two of said first circuit blocks;

wherein said input signal is supplied to the first switching element in the first one of said first circuit blocks with a pulse period greater than one cyclical period of said first timing signal and output signals are derived from the NOR gate circuits in said first circuit blocks.

2. A clock pulse generating circuit according to claim 1, wherein each of said first and second switching elements is formed with an insulated gate field effect transistor of the enhancement type with its gate being supplied with one of said first and second timing signals.

3. A clock pulse generating circuit according to claim 1, wherein said NOR gate circuit is formed with first and second insulated gate field effect transistors of the enhancement type with their drains connected to each other to make the output end thereof and their sources connected to each other, and the gates of said first and second transistors are supplied with the voltage obtained at the connecting point between said first switching element and said first capacitive element and said first timing signal, respectively.

4. A clock pulse generating circuit according to claim 1, wherein said first one of said first circuit blocks is connected with an additional inverter through which said input signal is supplied thereto.

* * * * *